(12) United States Patent
Ordonez Orellana et al.

(10) Patent No.: US 11,782,227 B2
(45) Date of Patent: Oct. 10, 2023

(54) WELD PROTECTION FOR HERMETIC WAFER-LEVEL SEALING

(71) Applicant: INDIGO DIABETES NV, Ghent (BE)

(72) Inventors: Juan Sebastian Ordonez Orellana, Ghent (BE); Paolo Cardile, Ghent (BE); Danae Delbeke, Gentbrugge (BE)

(73) Assignee: INDIGO DIABETES NV, Ghent (BE)

( * ) Notice: Subject to any disclaimer, the term of this patent is extended or adjusted under 35 U.S.C. 154(b) by 36 days.

(21) Appl. No.: 17/282,299

(22) PCT Filed: Oct. 7, 2019

(86) PCT No.: PCT/EP2019/077069
§ 371 (c)(1),
(2) Date: Apr. 1, 2021

(87) PCT Pub. No.: WO2020/070329
PCT Pub. Date: Apr. 9, 2020

(65) Prior Publication Data
US 2021/0382251 A1 Dec. 9, 2021

(30) Foreign Application Priority Data
Oct. 5, 2018 (EP) .................................. 18198990

(51) Int. Cl.
*G02B 6/42* (2006.01)

(52) U.S. Cl.
CPC ......... *G02B 6/4251* (2013.01); *G02B 6/4237* (2013.01)

(58) Field of Classification Search
CPC .............................. G02B 6/4251; G02B 6/4237
See application file for complete search history.

(56) References Cited

U.S. PATENT DOCUMENTS 8,129,269 B1 3/2012 Bao et al.
2003/0223709 A1* 12/2003 Lake .................... G02B 6/4248
385/94

(Continued)

FOREIGN PATENT DOCUMENTS

| EP | 1816498 A1 | 8/2007 |
| JP | S61229343 A | 10/1986 |
| JP | 2012079550 A | 4/2012 |

OTHER PUBLICATIONS

International Search Report and Written Opinion from PCT Application No. PCT/EP2019/077069, dated Dec. 12, 2019.

(Continued)

*Primary Examiner* — Sung H Pak
(74) *Attorney, Agent, or Firm* — WORKMAN NYDEGGER

(57) ABSTRACT

A multilayer stack comprises a surface wherein a predetermined region is defined for enclosing a device provided on the multilayer stack, the region being encircled by a welding zone defined on the surface, the welding zone being suitable for being welded by a welding radiation beam to a capping structure. It also comprises a first layer embedded within the multilayer stack, including at least one embedded component suitable for being functionally connected to the device provided on the multilayer stack. It furthermore comprises at least a second layer over the first layer comprising a shielding structure positioned between the at least one component of the first layer and the welding zone defined on the surface, the shielding structure being adapted to limit the welding depth of the welding radiation beam provided on the welding zone.

14 Claims, 5 Drawing Sheets

(56) References Cited

U.S. PATENT DOCUMENTS

2008/0253423 A1    10/2008  Kopp
2013/0032385 A1     2/2013  Lin et al.
2013/0120414 A1     5/2013  Sasagawa
2017/0118856 A1     4/2017  Blunier et al.
2019/0278036 A1*    9/2019  Lebby .................... H01S 5/026

OTHER PUBLICATIONS

Extended Search Report from corresponding EP Application No. EP18198990.6, dated Mar. 25, 2019.
Office Action from corresponding European Application No. 19779523.0-1001, dated Mar. 29, 2022.

* cited by examiner

WELD PROTECTION FOR HERMETIC WAFER-LEVEL SEALING

FIELD OF THE INVENTION

The invention relates to the field of wafer-level systems. More specifically it relates to weld protection for hermetically sealed, wafer-level systems and microsystems, such as for example for implantable and micromechanical (MEMS) devices.

BACKGROUND OF THE INVENTION

A wide range of applications, from automobile to medical technologies, require environmental protection of devices, especially devices included in microsystems. These applications may relate to sensing, signal processing, etc. Usually, protection is established by providing the device on a substrate and enclosing the device in a hermetically sealed cavity or enclosure or the like. While other parts of the microsystem may be in contact with the environment (for example, for measuring characteristics thereof), delicate devices of the system can be protected from the potentially damaging conditions, for example in harsh or corrosive environments.

The sealing of the device should be strong and resistant enough to these damaging conditions, ideally for a long period of time. Usually, microsystem manufacturing techniques implement bonding techniques to hermetically protect these specific devices or structures of a system against environmental influences. Soldering, anodic bonding, wafer bonding or eutectic sealing (e.g. AuSi eutectic bonding) are examples of these bonding methods.

Optical assemblies, including an implantable sensor, which can provide optical interaction with harsh environments are known, providing an optical interaction area exposed to e.g. a body fluid, and including components sealed from the fluid, in order to have a reliable and safe assembly as well as a safe use. The component is placed on a substrate and a cover cap encloses it, and wafer-to-wafer bonding is provided to hermetically seal the cap against the substrate. The assembly also provides an optical feedthrough extending underneath the substrate surface, from the sealed cavity to the optical interaction area on the substrate, without protruding the cap. In order to provide good sealing, sealing processes typically require elevated process temperatures and potentially also high voltages in combination with a specific chemical surface composition in the bonding zone to allow material transfer and ionic diffusion across the cap-substrate interface and create a hermetic seal. Temperature sensitive components cannot be sealed with such methods.

A solution for providing effective and reliable sealing, including effective hermetic sealing, is to provide laser welding. The energy is high enough to fuse materials, for example by providing molecular bonding, material transfer, etc., and the seal is resistant to harsh or corrosive environments. The fusion process is highly localized, so nearby devices and areas distributed laterally at a safe distance from the welded zone are not affected. However, given the thinness of the layer stacks in wafer-level processes, capping techniques involving laser may destroy any underlying structure at the level of the seam (e.g. horizontal feedthroughs) if these structures are located at a depth shallower than the welding depth.

A solution to combine signal interchange between the enclosed and the outside areas while implementing laser welding, is with the use of vertical feedthroughs through the substrate and avoiding placement of functional structures in the substrate under the welding area. However, this increases the size of the system, and vertical feedthroughs are usually less reliable and, in some types of systems, incompatible with standard manufacturing techniques.

SUMMARY OF THE INVENTION

It is an object of embodiments of the present invention to provide a multilayer stack and system including the stack, as well as methods of manufacturing them, which allow reliable hermetic sealing, even for harsh environments, by laser welding techniques, and improve profiling and/or reliability and/or compactness by allowing components to extend under the sealing zone of the device with reduced risk of damage or harmful modification or damage due to the laser welding.

The present invention relates to a multilayer stack, the stack comprising
a surface wherein a predetermined region is defined for enclosing at least one device provided on the multilayer stack, the region being encircled by a welding zone defined on the surface, the welding zone being suitable for being welded to a capping structure by a welding radiation beam,
a first layer embedded within the multilayer stack, including at least one embedded component suitable for being functionally connected to the device provided on the multilayer stack,
at least a second layer over the first layer and comprising a shielding structure positioned between the at least one component of the first layer and the welding zone defined on the surface, the shielding structure being adapted to limit the welding depth of the welding radiation beam provided on the welding zone.

It is an advantage of embodiments of the present invention that laser welding can be performed to bond the capping structure to the substrate, where the shielding layer limits the depth of weld. An additional advantage of some embodiments of the present invention is that standard process flows can be used to provide photonic platforms with horizontal feedthroughs suitable for providing hermetically sealed cavities.

The embedded components may comprise horizontal feedthroughs for interchanging signals between a region outside the welding zone and the region within the welding zone. It is an advantage of embodiments of the present invention that conventional fab and deposition techniques can be used to provide the multilayer stack.

The shielding layer may form a strip overlapping at least a section of the embedded components, the strip having a width extending parallel to the stack surface, such that a weld extending laterally and in depth can also be restrained from reaching the underlying first layer. The strip may have a width between 50 μm and 5 mm, e.g. between 100 μm and 1 mm. The width of the laser beam affected region (e.g. when using a single shot or line) may be between 5 and 30 μm. The width of the weld, typically caused by multiple parallel weld line used, may be between 20 and 500 μm. It is an advantage of embodiments of the present invention that laser weld spot expanding down the substrate will not affect the feedthroughs.

The shielding structures may comprise heat dissipation and/or radiation absorbing or heat and/or radiation deflecting or reflecting materials.

The stack may comprise a further layer between the first layer and the second layer, further comprising additional shielding structures. It is an advantage of embodiments of the present invention that it allows thin stacks and still provides protection to embedded components. It also allows adapting mechanical properties of stack at the welding zone, such as for example residual stress, coefficient of thermal expansion or heat dissipation.

The additional shielding structures may comprise metal. It is an advantage of embodiments of the present invention that the additional shielding is easy to provide.

The distance between the embedded components and the surface of the stack may be under 0.002 mm. In some embodiments the distance between the embedded components and the surface of the stack may be under 100 µm, e.g. may be under 20 µm or e.g. under 10 µm. It is an advantage of embodiments of the present invention that it provides a stack with low profile.

The predetermined region may be an optical interaction region. The embedded components may be optical feedthroughs being embedded waveguides in the substrate.

The present invention also relates to a sealed system including a multilayer stack as described above, a device provided within the predetermined region, the device being functionally connected to embedded components of the first layer, a capping structure being substantially transparent to a radiation beam (L) for welding the capping structure to the multilayer stack and being attached to the surface of the multilayer stack by laser welding on the welding zone and hermetically sealing the device, a welding depth being limited in the multilayer stack by the shielding structure of the multilayer stack.

The capping may be a glass, ceramic, silicon or metal cap and the radiation beam (L) is welding laser radiation.

It is an advantage of embodiments of the present invention that the laser can be provided through the glass, ceramic or silicon cap, directly on the welding zone. Nevertheless, it is to be noted that also a side laser weld can be used so that the laser does not need to go through the capping material.

The system may be an implantable optical or optoelectronic system comprising a photonic integrated circuit comprising an optical microstructure, the embedded structures being embedded waveguides for transferring optical radiation signals in the substrate.

The present invention also relates to a method of providing a multilayer stack, comprising providing a first layer embedded within the multilayer stack, including at least one embedded component suitable for being functionally connected to the device provided on the multilayer stack, providing at least a second layer over the first layer and comprising a shielding structure, providing a surface wherein a predetermined region is defined for enclosing at least one device provided on the multilayer stack, the region being encircled by a welding zone defined on the surface, the welding zone being suitable for being welded by a welding radiation beam to a capping structure, wherein the shielding structure is provided between the at least one component of the first layer and the welding zone defined on the surface, the shielding structure being adapted to limit the welding depth of a welding radiation beam provided on the welding zone. It is an advantage of embodiments of the present invention that a multilayer stack with high density and homogeneous distribution of components embedded therein can be provided. A further advantage is that the stack can be provided by standardized manufacture methods.

The at least one embedded component may extend laterally parallel to the surface, being suitable for carrying signals from the region predetermined on the surface. It is an advantage of embodiments of the present invention that reliable connections (such as horizontal feedthroughs) can be provided using standard ways and with no risk of damage in further processing.

The present invention furthermore relates to a method of providing a sealed device, comprising
providing a multilayer stack according to a method as described above,
providing a device on the predetermined region of the surface of the stack,
providing a capping structure by contacting the capping structure with the multilayer stack, the contact being made at or around the welding zone, thereby enclosing (803) the region with the device, and
welding the capping structure to the stack by providing a radiation beam on the welding zone for welding the capping structure to the multilayer stack, thereby attaching the capping structure to the surface of the stack, where the welding zone is provided so that shielding layer is positioned between the welding zone and the embedded components of the first layer. It is an advantage of embodiments of the present invention that a device can be reliably sealed with protecting embedded structures on the stack. The seal can be a hermetical seal.

It is an advantage of embodiments of the present invention that the process of laser welding is compatible with providing hermetic seal, so a device hermetically sealed and with embedded components not damaged by the welding process can be obtained.

Providing a capping structure may comprise providing a capping structure comprising zones with material substantially transparent to the radiation beam, and wherein providing a radiation beam comprises providing the radiation beam through said zones. It is an advantage of embodiments of the present invention that the radiation beam (e.g. laser) can be accurately positioned on the weld zone. Alternatively, a sideways welding may be applied, whereby the laser beam does not pass through the capping material.

Particular and preferred aspects of the invention are set out in the accompanying independent and dependent claims. Features from the dependent claims may be combined with features of the independent claims and with features of other dependent claims as appropriate and not merely as explicitly set out in the claims.

These and other aspects of the invention will be apparent from and elucidated with reference to the embodiment(s) described hereinafter.

Figure 1:
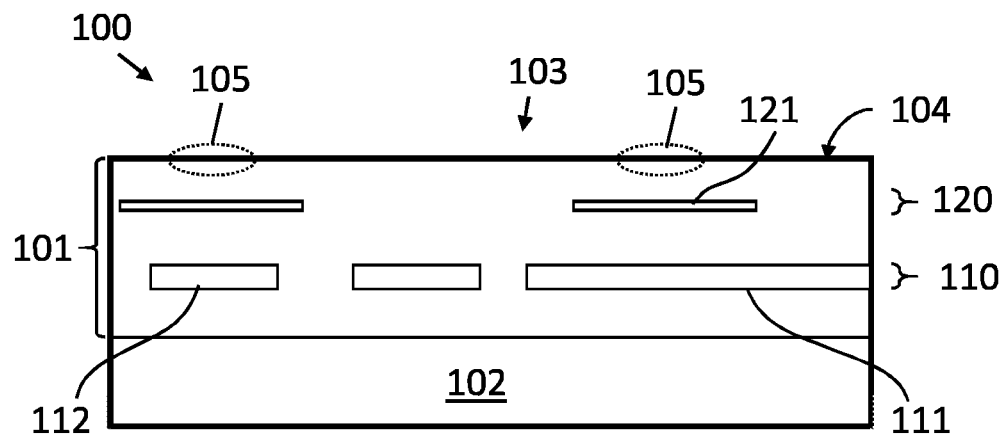
FIG. 1 illustrates a cross section of a multilayer stack suitable for providing a sealed device, according to embodiments of the present invention.

The drawings are only schematic and are non-limiting. In the drawings, the size of some of the elements may be exaggerated and not drawn on scale for illustrative purposes.

Any reference signs in the claims shall not be construed as limiting the scope.

In the different drawings, the same reference signs refer to the same or analogous elements.

DETAILED DESCRIPTION OF ILLUSTRATIVE EMBODIMENTS

The present invention will be described with respect to particular embodiments and with reference to certain drawings but the invention is not limited thereto but only by the claims. The dimensions and the relative dimensions do not correspond to actual reductions to practice of the invention.

Furthermore, the terms first, second and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the invention described herein are capable of operation in other sequences than described or illustrated herein.

Moreover, the terms top, under and the like in the description and the claims are used for descriptive purposes and not necessarily for describing relative positions. It is to be understood that the terms so used are interchangeable under appropriate circumstances and that the embodiments of the invention described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly, it should be appreciated that in the description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

In the description provided herein, numerous specific details are set forth. However, it is understood that embodiments of the invention may be practiced without these specific details. In other instances, well-known methods, structures and techniques have not been shown in detail in order not to obscure an understanding of this description.

Where in embodiments of the present invention reference is made to "feedthrough", reference is made to components, signal carriers and the like that trespass an enclosure, for example a signal carrier which can exchange signals with an enclosure such as a hermetically sealed cavity or barrier. This term not only refers to the common electrical conductors for carrying electrical signals, but also to photonic carriers for carrying optical signals, such as waveguides embedded on a substrate including such enclosure, or the like.

In order to provide low temperature hermetic sealing of a device, it is possible to use high powered radiation beams (such as laser beams) on a zone (welding zone) between a sealing capping structure, e.g. a cap, and a surface of the underlying layer where the device to be protected is provided. The laser beams provide sufficient localization of energy to bind and fuse the parts of the capping structure and the parts of the surface in contact together. The radiation beam produces structural changes in a volume of material surrounding the surfaces to be bonded. The bond is formed by diffusion and material transfer across the interface between the surface and the capping structure, along their contact zone, thus reliably sealing the region enclosed by the capping structure.

The energy provided by the radiation beam (e.g. laser) can be very localized, and thus it can avoid thermal effects caused in the stack or in the device by other types of attachment such as soldering, hot bonding or the like, which have a global impact of temperature increase on the device. For example, zones and devices at the sides of the laser weld do not substantially heat up. This makes laser welding suitable for sealing delicate and/or temperature sensitive devices, such as microbatteries, sensors, etc. The laser produces structural changes in a volume of material in the bodies to be connected. The volume with these structural changes is called the weld, and it includes the intermaterial bond but also an altered portion of the volume of material which does not participate directly in the bond, and which the present invention aims to limit.

In particular, the welding depth (the volume of material extending in the direction of the laser) in laser welding techniques is usually comparable or larger than the overall thickness of the thin layers formed on the substrate. Any structure or component underlying the welding spot would be destroyed. In existing devices, in order to interchange signals with devices in the sealed enclosure, vertical through-substrate feedthroughs are typically provided. In the specific field of photonics, since vertical feedthroughs are not compatible with standard manufacturing techniques, there is no report of the use of photonic (light) feedthroughs across a laser-welded hermetically sealed cavity, because the sealing technique destroys underlying structures to the extent that the transfer of light is lost.

The present invention provides a multilayer stack and system, e.g. a microsystem, including such stack, which allows structures and feedthroughs to be laid down underneath the bond between the capping structure and the surface of the stack. A shielding layer is provided between the embedded components and the zone where the welding takes place, so the welding depth is limited by the shielding layer. The shielding layer has optical properties such that the energy of the radiation beam (e.g. laser) is absorbed, deflected or otherwise restricted in depth (depth being defined as the distance in the direction perpendicular to the surface of the stack, oriented inwards the stack). The present invention also provides a method of manufacture of such stack and system.

Embodiments of the present invention enable the use of horizontal feedthroughs, obtainable by common microsystems fabrication techniques (such as layer deposition and removal), combined with the implementation of laser-welding which improves protection of, among others, temperature sensitive components (such as batteries, electronic components, lasers, solder joints, etc.)

In a first aspect, the present invention provides a multilayer stack which includes a first layer with components embedded in the stack, and which can be used to provide sealing to a device by laser welding. The components embedded in the stack may be positioned underneath, optionally extending underneath through, the zone of the surface which will be in contact and be welded to a capping structure, for hermetically sealing a device.

Such zone is defined as the welding zone of the stack, and it limits the region within which a device that needs the hermetic environmental protection shall be provided. In other words, the surface of the stack includes a region where the device can fit, and the region is delimited by a perimeter where the cap will contact the stack. The welding is provided within this contact zone between the cap and the stack.

The stack includes shielding structures in a second layer sandwiched between the welding zone and the embedded components, thus protecting these components from damage or undesired modification by the welding energy of the radiation beam (laser).

In some embodiments, the stack comprises or is part of an optical assembly, and is suitable for making an implantable opto-electronic device such as an implantable optical sensor, or for other applications in which devices benefit from being in a hermetic protected environment. In such an optical assembly, the embedded components providing signal feedthrough may be embedded waveguides, which need to be protected during the welding, i.e. bonding, process of the cap on the stack.

FIG. 1 shows a cross section of an exemplary stack system 100 including a multilayer stack 101 (or simply "stack") to some embodiments of the present invention. The figure shows a substrate 102 over which the multilayer stack 101 is provided. The substrate 102 is semiconductor wafer carrier, but the present invention is not limited thereto and it may be a glass wafer carrier or any other type of substrate suitable for providing layer stacks on top thereto, preferably for microsystems.

At least one first layer 110 is provided in the stack, including components 111, 112 embedded in the stack, for example buried in the stack. The components may include one more horizontal optical or electrical feedthroughs 111 trespassing laterally the welding zone, or optical or electrical tracks that run underneath the welding zone and are part of an embedded optical or electrical circuit, or parts of devices such as e.g. doped zones as part of integrated semiconductor components like diodes, transistors, etc., or parts of photonic devices such as e.g. ring resonators, splitters, AWG's, etc. These feedthroughs 111 can be used to connect (e.g. to bring signals in and/or take signals out from) any device provided on the region 103 of the stack surface 104 a sealed cavity or enclosure, and any device therein, with the external environment to allow electrical or optical interaction (for example, with a sensing zone), the present invention not limited thereto. The enclosure is delimited to the region 103 of the surface 104 of the stack 101 (or stack surface, explained below). More specifically, the region 103 is delimited or encircled by at least the welding zones 105.

In some embodiments of the present invention, these components 111, 112 are embedded photonic structures. Providing these components advantageously improves compactness of the stack, because more volume of the multilayer stack can be utilized by included embedded components. Moreover, components such as horizontal feedthroughs are preferred for ease of manufacture and reliability issues, as they are compatible with standard techniques in photonics and electronics, and they are in general more reliable than vertical feedthroughs.

At least one second layer 120 is provided in the stack, including shielding structures 121 at least partially overlapping structures of the first layer 110. The second layer can be considered a protective layer, which limits the welding depth and does not allow the welding energy of the laser to reach the components underneath. In particular, the shielding structures 121 are provided between the embedded structures 112 and feedthroughs 111 to be protected in the first layer and the welding zone 105 which shall be used to seal the stack to a capping structure. In some embodiments, they comprise a light trap, which can deflect optical power from the radiation (e.g. laser) beam. The light trap forming the shielding structure 121 may be for example a strip of material with properties chosen in accordance with the type of radiation beam to be used, so it can be used to heavily absorb the light for that type of radiation. Examples of materials that can be used are metals (e.g. Cu, Au, Pt, Al, Cr, . . . ), silicon, silicon carbide, silicon nitride and other semiconductor materials, etc. The thickness may range for example between e.g. 50 nm and 2000 nm, e.g. between 100 nm and 1500 nm, although embodiments are not limited thereto, and other thicknesses also may be used.

For instance, the material can be selected for absorbing radiation of a specific wavelength or range thereof, used in a welding laser.

The shielding structures are not limited to light traps, and they may comprise any material which absorbs, diffracts, deflects or reflects radiation, or the like, so as to limit the welding depth. The shielding structures typically may be outside the bond itself, i.e. they may be no part of the bond itself.

The first and second layer may include further materials, for example semiconductor material, such as silicon or the like.

The multilayer stack includes a stack surface 104 where a region 103 can be defined, where a device shall be placed and enclosed by a capping structure which shall be bonded or fused to the stack surface 104, for providing hermetic sealing. The region 103 has a perimeter delimited by a predetermined zone to be contacted by the capping structure, the predetermined zone or contact zone of the stack including the welding zone 105.

The present invention is not limited to the first and second layers. Additional layers can be included between the substrate 102 and the first layer 110, and/or between the first layer 110 and second layer 120, and/or between the second layer 120 and the stack surface 104 of the stack 101. The number of additional layers and their thickness also define the relative distances between substrate, first and second layers and surface of the stack. These additional layers may include homogeneous material and be free of components, for example, or may include further components and/or shielding structures as it will be explained with reference to FIG. 6.

In embodiments of the present invention, the surface of the multilayer stack is separated by at least 2 μm from the embedded component or components to be shielded (e.g. by including additional layers). This thickness, combined with the shielding structures, further improves the protection to the underlying components for a large range of materials and radiation beams. It also allows providing the shielding layer by standard processes avoiding the need of depositing metal shields.

For example, the additional layers and additional materials of the first and second layers may comprise or be made of semiconductor material, thus forming a semiconductor multilayer stack 101, although the present invention is not limited thereto, and several different conductors, semiconductors, non-conductors (glass, e.g. SiO2 or ceramics, e.g. SiC) or metals can be used, or combinations thereof. The materials typically may be opaque to the wavelengths used.

Figure 2:
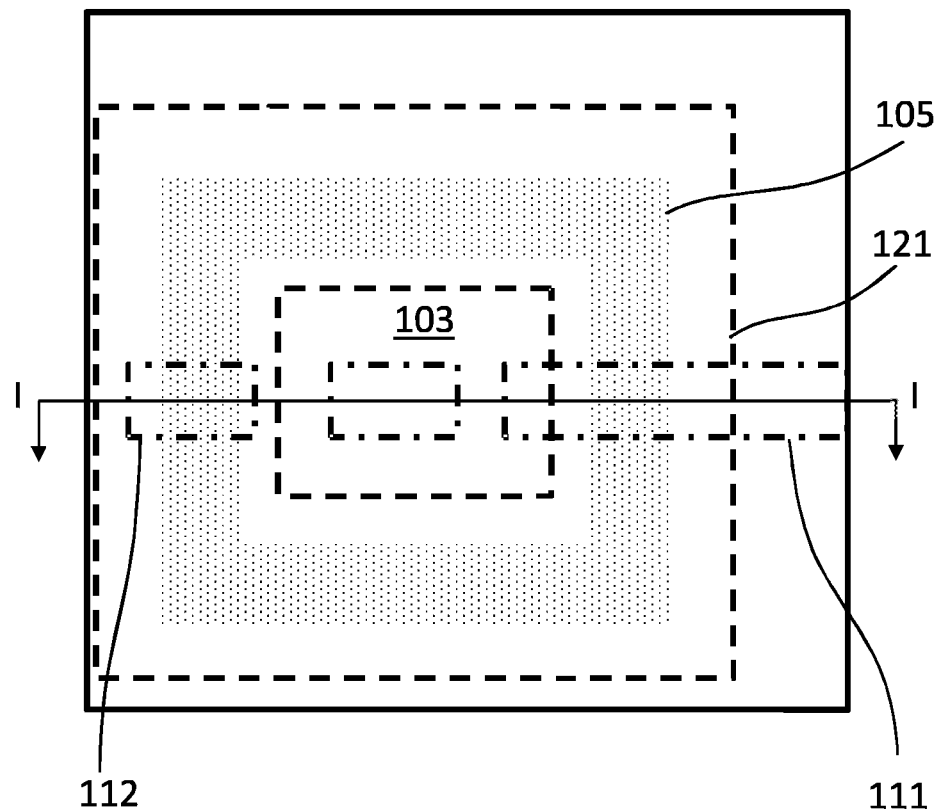
FIG. 2 illustrates a top view of the multilayer stack of FIG. 1, showing the weld zone, shielding structures and embedded components to be protected, projected on top of each other.

FIG. 2 shows an exemplary top view of the stack of FIG. 1. The line I-I with arrows shows the section line defining the cross section shown in FIG. 1. The structures 112 and feedthroughs 111 of the first layer are shown in dash-dot lines, while the shielding structure 121 of the second layer are shown in dashed lines. The shielding structure 121 is a strip of material for absorbing, deflecting, refracting or reflecting light, with a width such that protection of underlying components is ensured, allowing an amount of positioning error of the welding zone 105 shown as a pointed area. The disposition of the shielding structure 121 between the welding zone 105 and the components 112, 111 allow applying welding laser with reduced or no risk of reaching and damaging these components 111, 112.

In a second aspect, the present invention provides a system, for example a wafer-level system or microsystem, including a sealed device, for example a hermetically sealed device, including a multilayer stack according to embodiments of the first aspect of the present invention, further including a capping structure attached and laser-welded to the surface of the stack, the stack and the capping structure sealing (e.g. hermetically sealing) a device. The system includes components under the welding area defined within the contact zone of the surface of the stack. This advantageously increases compactness and density of the device, because the shielding layer protects these components, which otherwise would have to be placed away from the welding zone. The system may be an opto-electronic device or optical device, but also any semiconductor-technology based or metal component. The components to be shielded may be embedded waveguides, metal lines, or any other combination of materials that have a function within the microsystem.

Moreover, the presence of a shielding layer improves the reliability of the device, by allowing the possibility of using horizontal feedthroughs, which are generally more reliable in terms of hermeticity and yield than vertical (e.g. through-substrate) feedthroughs. Additionally, it allows using well known and standardized manufacturing techniques, especially in the field of photonic systems where vertical feedthroughs are incompatible with standard process flows.

Figure 3:
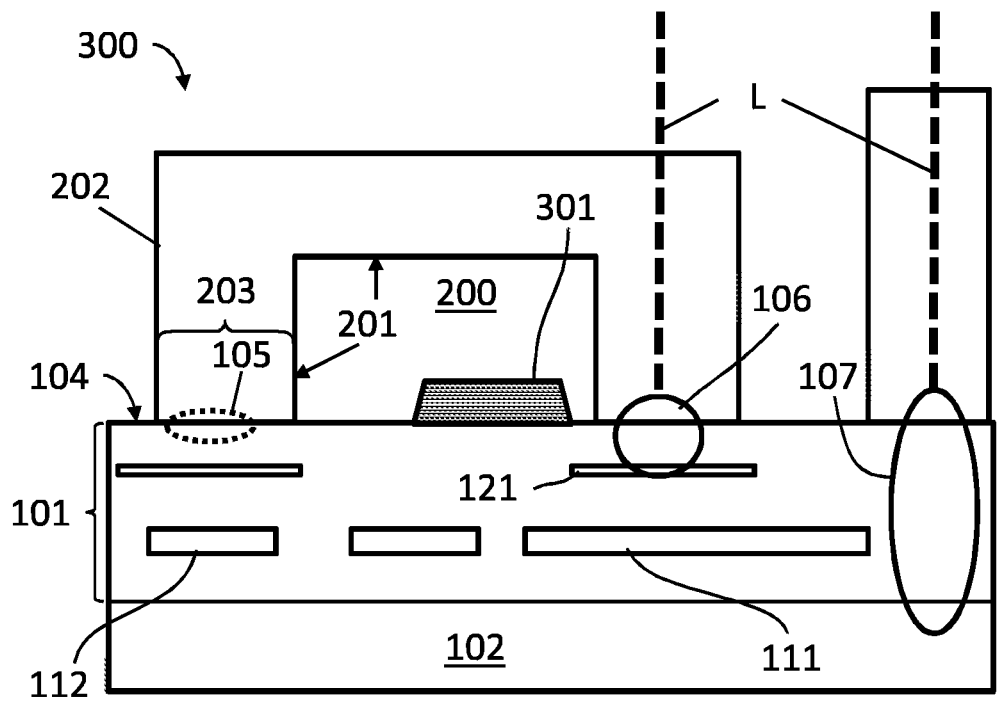
FIG. 3 illustrates a cross section of a system including a sealed device, according to embodiments of the present invention. It also shows the process of laser welding.

FIG. 3 shows an embodiment of a sealed system 300, in particular a microsystem (wafer-level) including a laser-sealed hermetic enclosure 200 delimited by the stack surface 104 of the multilayer stack 101 and the inner walls 201 of a cap 202 welded to the stack 101, implementing horizontal feedthroughs 111 and other structures 112 underneath the welding zone 105. The present invention allows using of horizontal feedthroughs, which improves profiling, because no structure needs to protrude from the substrate or from the cap for signal interchange.

In more detail, the microsystem 300 of FIG. 3 includes a stack 101 according to the embodiment shown in FIG. 1, and it further includes a cap 202 acting as a capping structure welded to the stack 101, forming the enclosure 200 which encloses, seals and preferably hermetically seals a device 301, which may be a processing unit, a sensor such as an optical sensor, etc. The welding zone 105 is defined within the interface of the contact zones defined on the surface of the stack and a surface in the cap. The cap 202 may comprise a block of material with a cavity formed therein, the cavity being open through an aperture facing the flat surface of the stack. The cavity may be formed advantageously with well-known techniques. The surface between the aperture of the cap and the external walls of the cap may comprise the contact zone 203 between the cap and the stack surface 104. However, the present invention is not limited by the shape of the capping structure or of the multilayer stack, and the capping structure may comprise for example a sheet of material, and the multilayer stack may comprise the cavity wherein the device to be protected rests.

In the figure, the process of welding by laser L is also being shown, where the shielding structure 121 is able to limit the depth of the weld 106. The laser has an energy such that it changes the structure and provides material diffusion to create the necessary bonding, but only to a depth does not reach the components 111, 112 of the first layer. An example of the depth of a weld 107 produced by a weld radiation beam, e.g. the same laser L (or a laser of the same type), on an unshielded part of the stack is also shown. In this particular case, the welding depth is larger than even the thickness of the multilayer stack, so it reaches the substrate 102.

The cap 202 may comprise any kind of suitable material, but in some embodiments it is preferred that the cap comprises or is made of material which is substantially transparent to the radiation beam used for welding, so welding can be provided with accurate positioning. For example, a glass, ceramic or semiconductor, e.g. silicon, cap may be provided, so most types of welding laser can be directed to the welding zone through the cap as shown in FIG. 3, improving welding accuracy. The surface of the multilayer stack may comprise glass, or a semiconductor such as silicon, although any suitable material susceptible of being welded to the cap can be used.

The capping structure attached to the multilayer stack may provide a hermetically protected environment or enclosure 200 for the device 301 or devices to be protected. Such hermetically sealed environment may maintain a constant pressure, e.g. higher or lower than atmospheric pressure. The sealed cap may present high resistance to harsh environments such as corrosive fluids or gasses, thus protecting the device against these.

Figure 4:
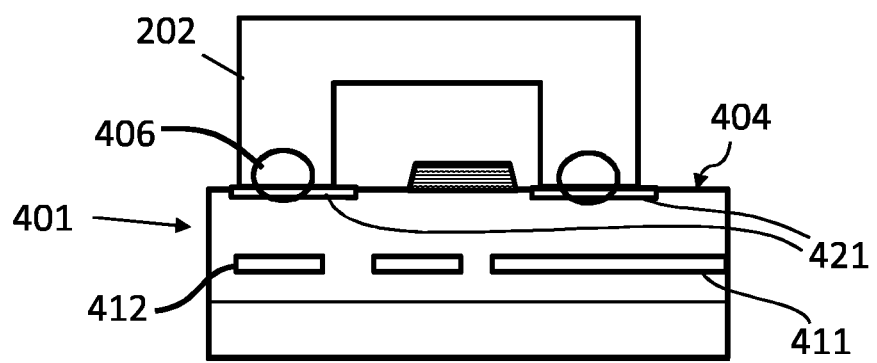
FIG. 4 illustrates a cross section of a system including a sealed device, according to embodiments of the present invention, where the shielding structure is part of the stack surface.
Figure 5:
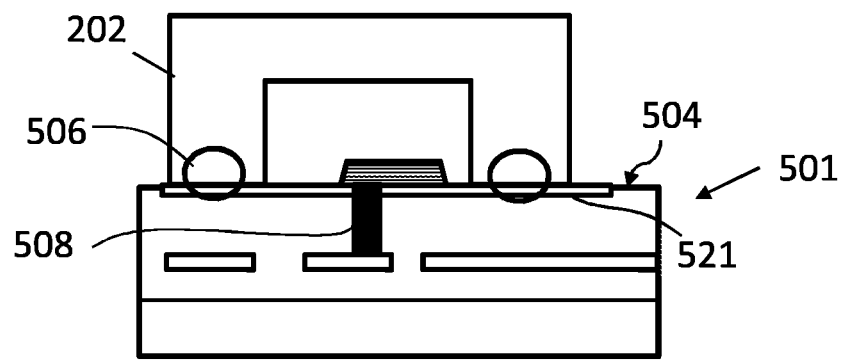
FIG. 5 illustrates a cross section of a system including a sealed device, according to embodiments of the present invention, where the shielding structure is a plate, and where the shielding structure is part of the stack surface.
Figure 6:
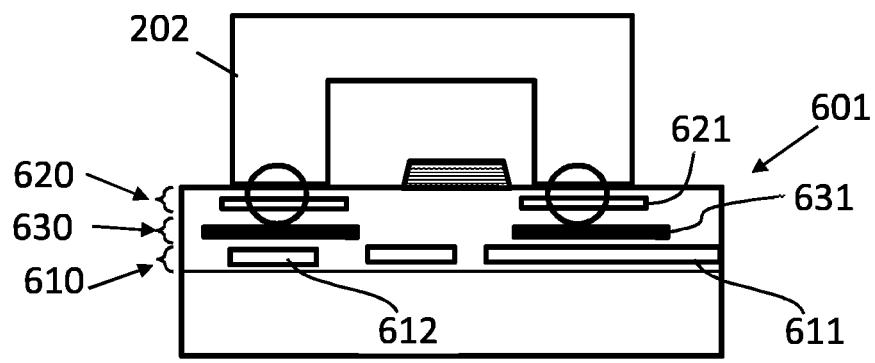
FIG. 6 illustrates a cross section of a system including a sealed device, including a plurality of shielding structures included in different layers of the multilayer stack.

FIG. 4 to FIG. 6 show different embodiments of sealed systems, where different embodiments of the multilayer stack of the first aspect are shown together with the welded cap, forming a protective environment (e.g. a hermetically sealed protective environment) for a device such as an active component, a sensor, a processor, etc.

FIG. 4 shows a shielding structure 421 provided on the stack and being part of the surface 404 of the multilayer stack 401. The system can be compared to the system in FIG. 3, where the multilayer stack includes an additional layer between the surface and the shielding layer, so the shielding layer is buried in the multilayer stack 101. The welding in the embodiment of FIG. 3 is provided mainly between this additional layer and the cap. On the other hand, in the case of FIG. 4, the film is provided directly as part of the surface 404 (e.g. by deposition) of the stack 401. The cap 202 is welded directly on the shield layer 421, thus limiting the depth of the weld 406 and removing the excess energy so it does not reach the underlying components 411, 412 at levels that could be destructive or detrimental to those components.

FIG. 5 shows a shielding structure 521 being part of the surface 504 of the multilayer stack 501, the same as in FIG. 4, but instead of having the shape of a strip forming a frame as shown in FIG. 2, the shielding structure 521 is a continuous plate or sheet, forming part of the surface 504 of the multilayer stack, over which the cap 202 is welded. If needed, connecting features 508, such as vias or windows, may be locally provided through the shielding layer to functionally connect any device within the sealed enclosure to any suitable component embedded in the multilayer stack 501. The depth of the weld 506 is also reduced as compared to the case where no shielding structure 521 was provided.

The embodiments shown in FIG. 4 and FIG. 5 have the advantage that the shielding structures 421, 521 are easily provided with no need to further embed them.

In some embodiments of the present invention, the system includes stacks where the distance between the surface and the underlying components is at least 2 µm, improving protection as explained with reference to embodiments of the first aspect. However, for some applications this is not possible, because the system requires a multilayer stack thinner than 2 µm. In such cases, the multilayer stack of the system may include a third layer, also protective layer, including an extra shielding structure.

FIG. 6 shows an embodiment similar to that of FIG. 3, with the difference that the stack 601 of the embodiment of FIG. 6 includes one extra shielding structure 631 between its first layer 610 and its second layer 620. For example, the extra shielding structure 631 may be provided in a third layer 630 of the stack. It may comprise for example a metal plate or strip embedded between a light trap 621 and the components 611, 612 of the first layer. Examples of further shielding structures include metals such as Al, Cu, Cr, Pt, Au, W—Ti, Ti, metal alloys, etc. with a thickness, e.g. from a range 50 nm to 2000 nm, e.g. from a range 50 nm to 500 nm.

Such stack can be made thinner than 2 µm, it can provide a hermetically sealed attachment between the stack 601 and a cap 202, and still limiting the welding depth and/or provide good protection to underlying components such as feedthroughs 611, thereby allowing microsystems with very low profile.

Additionally, the mechanical properties of the stack at the welding zone can be adapted by inclusion of multiple shielding layers. In one example, some layers may initially induce a pre-stress for compensating stress induced during the welding.

In a third and fourth aspects, the present invention provides a process of manufacturing a multilayer stack and respectively a process to manufacture a system comprising a sealed device. The method of manufacture of the multilayer stack may advantageously avoid providing vertical (e.g. through-substrate) vias or vertical feedthroughs, thus allowing standardized process flows compatible with photonics technology.

The method according to embodiments of the third aspect includes the steps of providing a component embedded in the multilayer stack, providing a surface with a zone to be welded to a capping structure, and providing a shielding structure between the embedded components and the zone to be welded to the capping structure.

Figure 7:
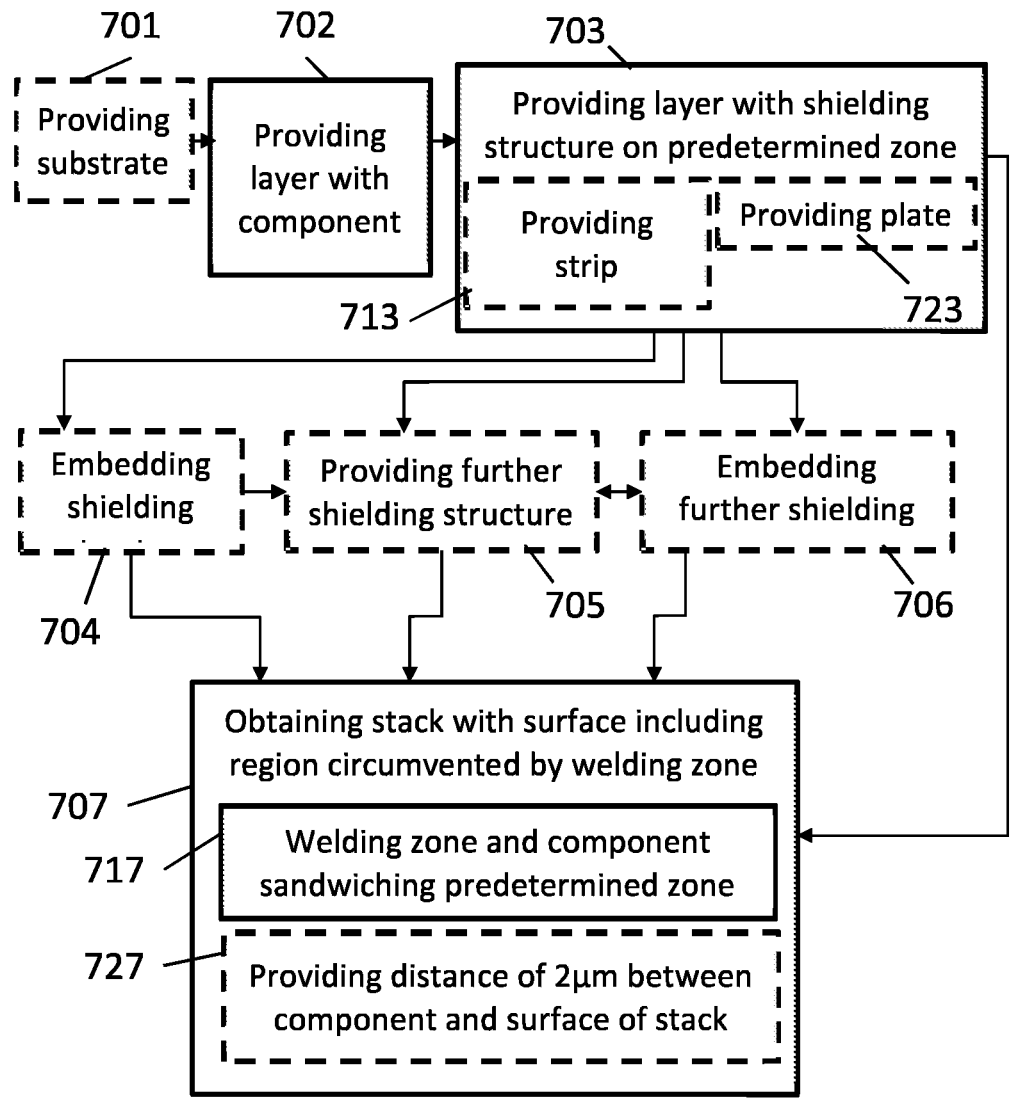
FIG. 7 is a flowchart of a method of manufacturing a multilayer stack, according to embodiments of the present invention.

FIG. 7 is an exemplary process flow including the steps of exemplary embodiments of the third aspect, together with optional steps in dashed boxes. In a first step, the method may comprise providing 701 a substrate, for example a semiconductor or glass substrate. A further step comprises providing 702 at least one embedded component is provided, e.g. in a first layer. It may be an active component, it may be a signal carrier for interchanging signals with a device harbored within the sealed enclosure (such as a horizontal feedthrough), etc. It may be an electronic or an optical component extending parallel to the surface of the stack, such as an embedded waveguide, for example.

A further step may comprise providing 703 at least one shielding structure, e.g. in a second layer. For example, the step may comprise providing 713 a strip enclosing an area, or providing 723 a plate. The strip or plate may for example have a thickness between 50 nm and 2000 nm, e.g. between 100 nm and 1500 nm. The shielding structure may include any material discussed with reference to embodiments of the first aspect of the present invention.

In some embodiments of the present invention, the method comprises the step of embedding 704 the shielding structure. This may allow increasing the thickness and selecting suitable materials for welding to a capping structure.

The method may optionally comprise providing 705 at least a third or further layer comprising further shielding structures, for example metal layers, which may be provided by deposition, e.g. metal deposition, sputter deposition, chemical vapor deposition, etc. An additional plating step to get a thicker layer also could be applied. These further structures and layers may be also embedded 706.

The method thus obtains 707 a stack with a surface where a region can be defined for including a device to be protected. The shielding structure or structures of the second layer should be provided 717 between the embedded components and the areas to be welded to a capping structure, or welding zone, encircling the region where the device shall be included. Or in other words, providing the surface including the region encircled by the welding zone should be done 717 so the welding zone and the embedded components sandwich the shielding structures on the predetermined zone.

In some embodiments of the present invention, the second layer is embedded 704 within the multilayer stack, and a further additional layer is provided on top thereof, obtaining 707 the stack with the surface. In other embodiments, obtaining 707 the stack with the surface comprises providing 703 the shielding structures on a second layer, so the shielding structures form the surface of the multilayer stack. Alternatively, the method may include embedding 704 the shield structure, providing 705 a layer with a further shielding structure, and either directly obtaining 707 the stack where the surface of the stack includes the shielding structure, or embedding 706 the further shielding structure, thus obtaining 707 the stack.

Providing 702, 703, 705 the different components (e.g. horizontal feedthroughs), shielding structures and the like in layers, and embedding 704, 706 these layers with intermediate layers can be done with controlling the thickness of the layers, thus controlling the thickness of the stack. For example, obtaining the stack may comprise obtaining 727 a stack with a predetermined distance (e.g. 2 µm) between the embedded components and the surface of the stack.

The method has the advantage that it implements layer-deposition methods typical for the manufacturing of thin-film wafer level structures (physical and chemical vapor deposition and photolithography techniques). For example, the first, second and further layers, and/or any further additional layers may be provided by deposition, e.g. CVD, PVD, photolithography techniques, etc., which are standard. The method advantageously provides a multilayer stack with common techniques, which is suitable for providing hermetic sealing of a device by laser welding, and with no risk of damage of components embedded in the layer. In particular, the method of the present invention allows providing a photonics multilayer stack by standard fabrication techniques, including providing horizontal feedthroughs, and which provides protection of the feedthroughs, thus allowing laser welding for hermetic sealing.

In a fourth aspect, the invention provides a method for manufacturing a system (e.g. a microsystem) including a hermetically sealed device, which can be compact and follow standard, wafer-level process routes. The method according to embodiments of the fourth aspect includes the steps of providing a multilayer stack according to the method of the third aspect, providing a device on the surface of said multilayer stack, providing a capping structure in a contact area of the multilayer stack, providing a radiation beam on a welding zone within the contact area, and fusing the capping structure to the multilayer stack thereby sealing the device within an enclosure, for example hermetically sealing the device. The shielding structure between the embedded components and the welding zone limit the welding depth, thus protecting the embedded components.

Figure 8:
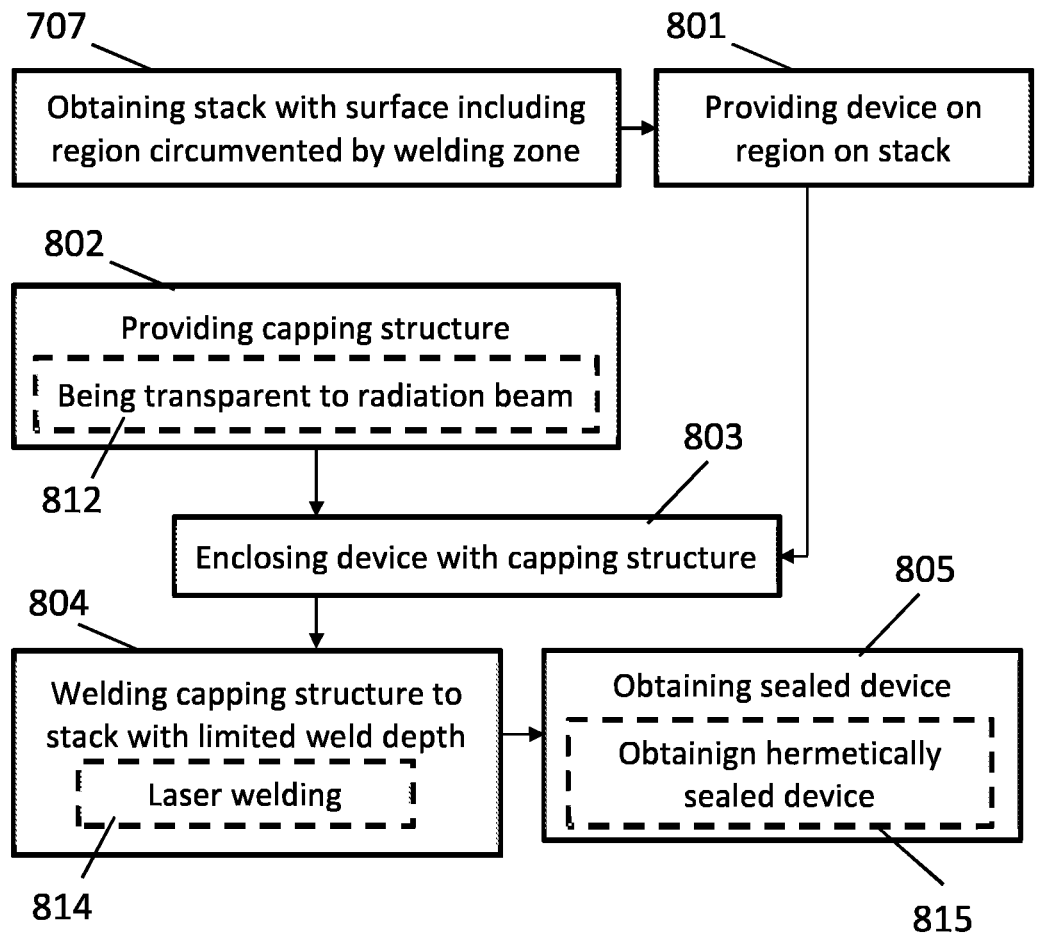
FIG. 8 is a flowchart of a method of manufacturing a system including a sealed device, according to embodiments of the present invention.

FIG. 8 is a process flow with the steps of an exemplary method according to an embodiment of the fourth aspect, together with optional steps. In a first step, the method comprises obtaining 707 a stack according to embodiments of the third aspect, and afterwards providing 801, e.g. installing, a device on a predetermined region of the multilayer stack. This may include providing structures (gratings, windows, vias, etc.) for allowing functional contact between the device and any suitable embedded component.

The method further comprises providing 802 a capping structure, such as a cap, which may be 812 transparent to the radiation beam to be used for welding; for example it may comprise or be made of a material transparent to the radiation beam to be used for welding. For example, the capping structure may comprise a glass or ceramic, silicon or metal cap, some which allow the passage of most welding lasers. The material of the cap in some embodiments is transparent to the applied wavelength and has mechanical properties that math those of the substrate. Else, the material can be welded implementing laser radiation entering at an angle to the weld zone. This allows accurately positioning and orienting the radiation beam, so the welding zone is projected completely over the shielding layer, and the weld does not reach unprotected sections of the embedded devices.

The present invention is not limited thereto, and the laser processing may be provided outside the capping structure, oblique to the contact surface between the cap and the stack.

The method comprises enclosing 803 the device with the capping structure, by placing the capping structure in close contact with the multilayer stack, by providing contact between a contact zone defined in the multilayer stack and a contact zone defined in the capping structure, thus defining a mutual contact zone. In some embodiments, the welding zone is defined strictly within the mutual contact zone.

In some embodiments of the present invention, obtaining the stack 707 includes obtaining a planar multilayer stack, with no pillars or cavities for providing the enclosure, and providing 802 the capping structure comprises obtaining a capping structure with a cavity. Thus, the enclosing 803 the device comprises enclosing the device by inner walls of a cavity in the cap (which may be provided by, for example, etching) and by the planar surface of the stack. The manufacture of such elements follows advantageously standard wafer processing techniques, with no need to provide a cavity in the multilayer stack.

The method further comprises welding 804 the capping structure to the stack with a radiation beam. The beam may be a high energy welding beam, where the energy is localized and heat transmission to nearby regions is reduced. It is advantageous that the stack and devices therein do not need to be submitted to temperatures so high that the device may become damaged.

Providing the beam may comprise providing 814 laser welding. Advantageously, laser-welding can be implemented to seal glass-to-silicon or glass-to-glass at room temperature ("room temperature laser welding process"), without putting temperature sensitive components at risk. The shielding structure of the stack (provided in the third aspect of the present invention) has optical properties such that it traps the radiation (and thus the energy) of the beam, for example it may be a light trap, obtaining a limited welding depth.

In some embodiments, providing 814 laser welding can be performed using a picosecond or a femtosecond laser. The physics of picosecond- and femtosecond laser welding have the advantage of avoiding thermal effects caused in some systems by nanosecond laser welding or by constant-wave welding methods.

The method thus obtains 805 a system including a sealed device. This may be performed under suitable conditions, allowing obtaining 815 a hermetically sealed device. The process may be advantageously a wafer-level process.

The method of hermetically sealing the device may comprise other known steps, such as preclamping the capping structure to the substrate before welding, providing high pressure or vacuum for providing an enclosure with pressure higher, respectively lower, than the atmospheric pressure, etc.

In summary, in embodiments of the present invention, a cap is welded to a multilayer stack with a surface, and the weld being produced between the top surface and the surface of the capping structure is limited in depth. The weld zone is localized to avoid damage or modification of underlying components and structures, thanks to the shielding layer.

The invention claimed is:

1. A multilayer stack, the stack comprising:
a surface wherein an optical interaction region is defined for enclosing at least one device provided on the multilayer stack, the region being encircled by a welding zone defined on the surface, the welding zone being suitable for being welded to a capping structure by a welding radiation beam to form a bond between the capping structure and the surface of the multilayer stack,
a first layer embedded within the multilayer stack, including at least one embedded waveguide suitable for being functionally connected to the device provided on the multilayer stack,
at least a second layer over the first layer and comprising a shielding structure positioned between the at least one embedded waveguide of the first layer and the welding zone defined on the surface, the shielding structure being adapted to limit the welding depth of the welding radiation beam provided on the welding zone, the shielding structure being outside the bond.

2. The multilayer stack according to claim 1, wherein the embedded waveguides comprise horizontal feedthroughs for interchanging signals between a region outside the welding zone and the region within the welding zone.

3. The multilayer stack according to claim 1, wherein the shielding layer forms a strip overlapping at least a section of the embedded waveguides, the strip having a width extending parallel to the stack surface, such that a weld extending laterally and in depth can also be restrained from reaching the underlying first layer.

4. The multilayer stack according to claim 1, wherein the shielding structures comprise heat dissipation and/or radiation absorbing or heat and/or radiation reflecting materials.

5. The multilayer stack according to claim 1, the stack comprising a further layer between the first layer and the second layer, further comprising additional shielding structures.

6. The multilayer stack according to claim 5, wherein the additional shielding structures comprise metal.

7. The multilayer stack according to claim 1, wherein the distance between the embedded waveguides and the surface of the stack is under 0.002 mm.

8. A sealed system including:
a multilayer stack according to claim 1,
a device provided within the predetermined region, the device being functionally connected to embedded waveguides of the first layer,
a capping structure being substantially transparent to a radiation beam for welding the capping structure to the multilayer stack and being attached to the surface of the multilayer stack by laser welding on the welding zone and hermetically sealing the device, a welding depth being limited in the multilayer stack by the shielding structure of the multilayer stack.

9. The system of claim 8 wherein the capping is a glass, ceramic or silicon, or metal cap and the radiation beam is welding laser radiation.

10. The system according to claim 8, the system being an implantable optical or opto-electronic system comprising a photonic integrated circuit comprising an optical microstructure.

11. A method of providing a multilayer stack, comprising:
providing a first layer embedded within the multilayer stack, including at least one embedded waveguide suitable for being functionally connected to the device provided on the multilayer stack,
providing at least a second layer over the first layer and comprising a shielding structure,
providing a surface wherein a predetermined region is defined for enclosing a device provided on the multilayer stack, the region being encircled by a welding zone defined on the surface, the welding zone being suitable for being welded by a welding radiation beam to a capping structure to form a bond between the capping structure and the surface of the multilayer stack,
wherein the shielding structure is provided between the at least one component of the first layer and the welding zone defined on the surface, the shielding structure being adapted to limit the welding depth of a welding radiation beam provided on the welding zone, the shielding structure being outside the bond.

12. The method of claim 11, wherein the at least one embedded waveguide extends laterally parallel to the surface, being suitable for carrying signals from the region predetermined on the surface.

13. The method of claim 11, the method further comprising:
providing a device on the predetermined region of the surface of the stack,
providing a capping structure by contacting the capping structure with the multilayer stack, the contact being made at or around the welding zone, thereby enclosing the region with the device, and
welding the capping structure to the stack by providing a radiation beam on the welding zone for welding the capping structure to the multilayer stack, thereby attaching the capping structure to the surface of the stack, where the welding zone is provided so that shielding layer is positioned between the welding zone and the embedded waveguides of the first layer.

14. The method of claim 13 wherein providing a capping structure comprises providing a capping structure comprising zones with material substantially transparent to the radiation beam, and wherein providing a radiation beam comprises providing the radiation beam through said zones.

* * * * *